(12) United States Patent
Baringer et al.

(10) Patent No.: US 7,158,760 B1
(45) Date of Patent: Jan. 2, 2007

(54) FREQUENCY SYNTHESIZER WITH SELECTABLE PRECONFIGURED SYNTHESIZER CHARACTERISTICS

(75) Inventors: William B. Baringer, Oakland, CA (US); Cormac S. Conroy, Sunnyvale, CA (US); Sang Oh Lee, San Jose, CA (US); Seok Kang, Daejeon (KR); Beomsup Kim, Cupertino, CA (US)

(73) Assignee: Qualcomm Inc., San Diego, CA (US)

( * ) Notice: Subject to any disclaimer, the term of this patent is extended or adjusted under 35 U.S.C. 154(b) by 339 days.

(21) Appl. No.: 10/227,634

(22) Filed: Aug. 22, 2002

(51) Int. Cl.
  *H04B 1/40* (2006.01)
  *H04B 7/00* (2006.01)
  *H04B 1/18* (2006.01)

(52) U.S. Cl. .............. 455/76; 455/260; 455/150.1; 455/165.1

(58) Field of Classification Search .......... 455/76, 455/165.1, 185.1, 78, 260, 163.1, 150.1, 455/161.1; 331/1, 36 V, 2, 14, 16; 370/278
See application file for complete search history.

(56) References Cited

U.S. PATENT DOCUMENTS

| 5,224,152 | A | * | 6/1993 | Harte ........................ 455/574 |
| 5,438,329 | A | * | 8/1995 | Gastouniotis et al. .. 340/870.02 |
| 5,576,715 | A | * | 11/1996 | Litton et al. ........... 342/357.12 |
| 6,707,342 | B1 | * | 3/2004 | Zachan et al. ................. 331/2 |

\* cited by examiner

*Primary Examiner*—Tilahun Gesesse
(74) *Attorney, Agent, or Firm*—Philip R. Wadsworth; Charles D. Brown; Kenyon S. Jenckos

(57) ABSTRACT

A system and method are disclosed for configuring a frequency synthesizer in a transceiver. Configuring a frequency synthesizer in a transceiver includes specifying a selection bit sequence wherein the selection bit sequence corresponds to a predetermined combination of transceiver characteristics; determining a plurality of synthesizer configuration parameters using the selection bit sequence; and configuring the frequency synthesizer using the plurality of synthesizer configuration parameters.

32 Claims, 6 Drawing Sheets

FREQUENCY SYNTHESIZER WITH SELECTABLE PRECONFIGURED SYNTHESIZER CHARACTERISTICS

CROSS REFERENCE TO RELATED APPLICATIONS

This application is related to co-pending U.S. patent application Ser. No. 10/227,632 entitled "DYNAMIC FREQUENCY SYNTHESIZER CONFIGURATION" filed concurrently herewith, which is incorporated herein by reference for all purposes; and co-pending U.S. patent application Ser. No. 10/227,633 entitled "FREQUENCY SYNTHESIZER WITH ON-CHIP REGISTERS" filed concurrently herewith, which is incorporated herein by reference for all purposes.

FIELD OF THE INVENTION

The present invention relates generally to communication systems. More specifically, a frequency synthesizer design is disclosed.

BACKGROUND OF THE INVENTION

Communication systems often need to modulate a baseband signal to radio frequency (RF) for transmission, or demodulate an RF signal to baseband for reception. Usually, the initial signal is mixed with a signal at a predetermined frequency, to produce an intermediate frequency (IF) signal. The IF signal is commonly mixed again to produce a signal at a desired frequency band. In a typical modern communication system, a programmable frequency IC, or frequency synthesizer, is often used to provide the predetermined frequency signal.

The following example illustrates how a frequency synthesizer is used to provide the local oscillator (LO) frequency in a receiver. FIG. 1 is a block diagram illustrating a superheterodyne receiver similar to one that is used in a cellular telephone. The received RF signal is first amplified by low noise amplifier (LNA) 100. Mixer 105 mixes the amplified RF signal with another signal generated by RF LO 125, to produce an IF signal. The resulting IF signal is filtered by filter 110, and then amplified by variable gain amplifier (VGA) 115. Mixer 120 mixes the resulting signal with a fixed frequency signal generated by IF LO 130 to produce the signal in the desired baseband.

IF LO 130 is commonly implemented using a frequency synthesizer. The synthesizer has registers that are programmed with parameters needed to generate the desired IF frequency. FIG. 2 illustrates how a synthesizer is configured in a conventional implementation. External microcontroller 200 loads configuration parameters into synthesizer's registers 205 to configure phase locked loop and voltage controlled oscillator (PLL-VCO) 210 to generate the desired frequency. Block 215 is the synthesizer containing registers 205 and PLL-VCO 210; the rest of the synthesizer components are not shown. In existing implementations, the microcontroller writes multiple register values to the synthesizer's registers via a bus, typically a serial bus, thus slowing down the initialization process.

Another disadvantage of current implementations is that whenever the synthesizer is powered off, the configuration parameters in the registers are lost and must be reloaded the next time the synthesizer is powered on. Communication devices that employ transceivers, such as GSM phones, are often designed to turn the transceiver off between bursts to save power. In the case of a cellular phone, the transceiver's synthesizer is turned off and on many times during a phone call. The synthesizer transitions from an inactive state to an active state frequently and its power is turned off and on repeatedly. As a result, the registers must be reloaded during every power cycle, causing long initialization times as well as unnecessary power consumption. There is a need to reduce the synthesizer initialization time and power consumption caused by repeated register reloads.

BRIEF DESCRIPTION OF THE DRAWINGS

The present invention will be readily understood by the following detailed description in conjunction with the accompanying drawings, wherein like reference numerals designate like structural elements, and in which:

FIG. 3 is a flow chart of one embodiment of the initialization process when the synthesizer powers on.

DETAILED DESCRIPTION

Figure 1:
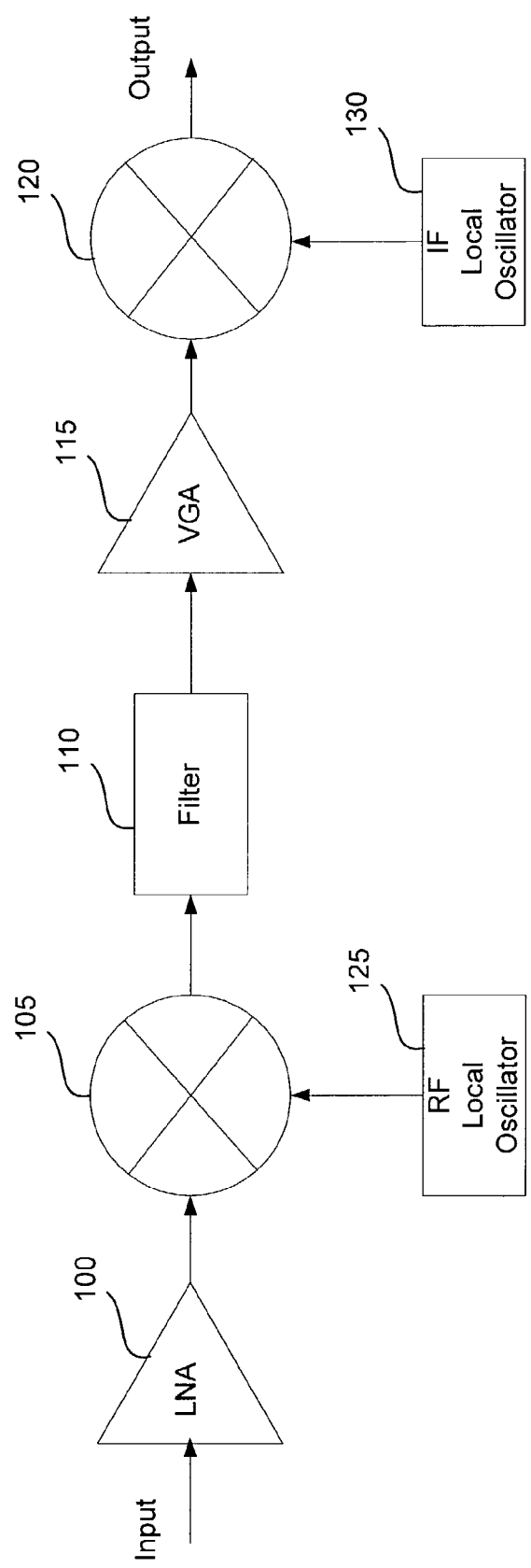
FIG. 1 is a block diagram illustrating a superheterodyne receiver similar to one that is used in a cellular telephone.
Figure 2:
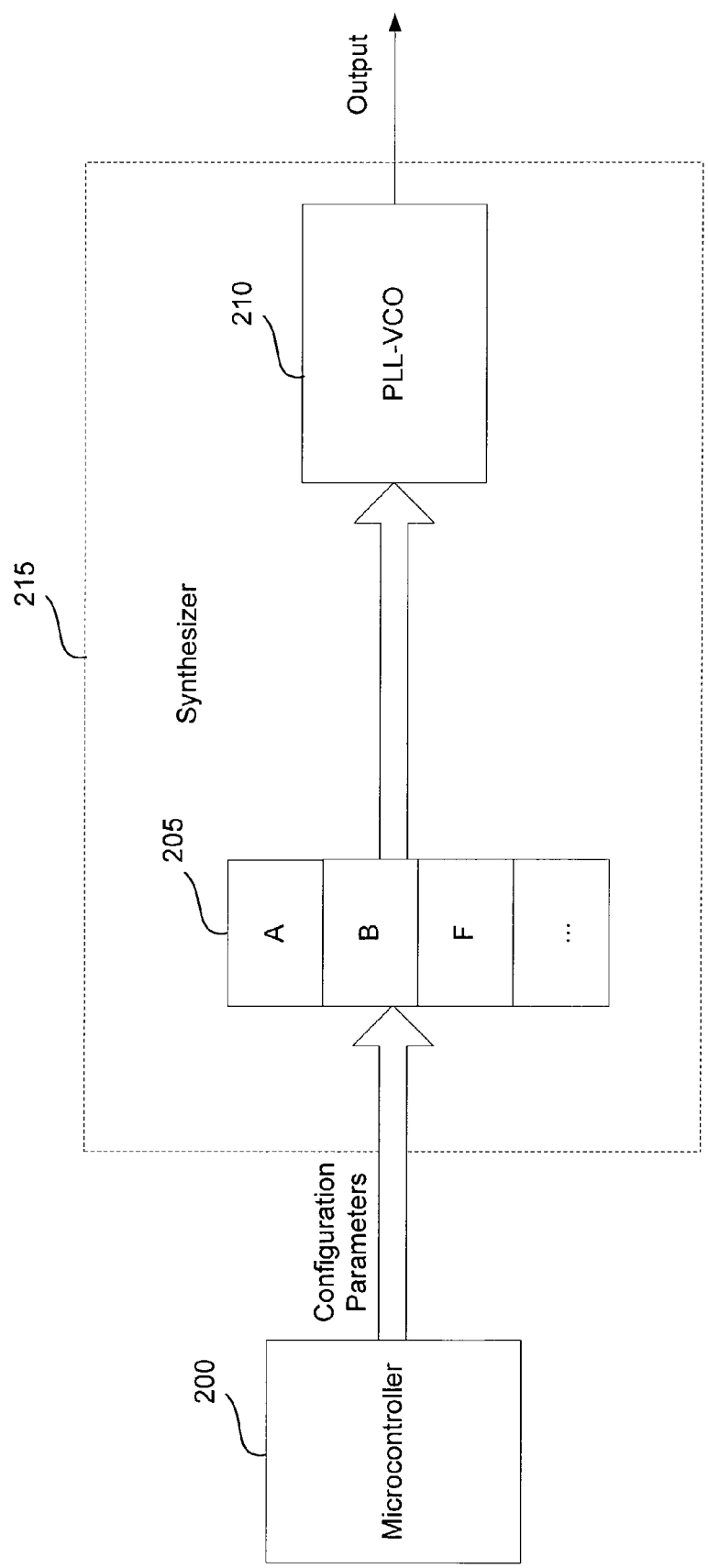
FIG. 2 illustrates how a synthesizer is configured in a conventional implementation.

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention are provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

A synthesizer design is disclosed. The design efficiently handles the initialization of the synthesizer and reduces its initialization time and power consumption. In one embodiment, an external data programming source such as a baseband modem, microprocessor or microcontroller writes a selection bit sequence to the synthesizer, and the synthesizer generates its configuration parameters based on the selection bit sequence. In certain embodiments, the selection bit sequence is stored in non-volatile storage memory and retrieved during configuration.

For purposes of this specification, a receiver that contains frequency synthesizers used for cellular applications will be discussed in detail. It should be noted that the architecture and methods described are equally applicable to synthesizers used in transmitters and transceivers used in cellular or other communications applications.

A compression scheme to reduce the number of register loads during the synthesizer's initialization is disclosed. Typically, a synthesizer makes use of a stable reference frequency, as generated by an external frequency reference source. In practice, there are a few types of frequency reference sources that are suitable for cellular applications, hence the number of possible reference frequencies are limited. Also, because of the limited number of standards in existence, the number of IF values that need to be generated by the synthesizer are also limited. Therefore, the initialization process of the synthesizer can be implemented more efficiently by taking advantage of the fact that a limited number of transceiver characteristics determine a limited set of synthesizer configuration parameters.

Table 1 illustrates how the compression is done in one embodiment. In this embodiment, temperature compensated crystal oscillators (TCXOs) are used as the reference frequency source. In some embodiments, other reference frequency sources such as temperature compensated voltage controlled crystal oscillators (TCVCXOs) may be used. In this example, three possible TCXO reference frequency values, 19.2, 19.68, 19.8 MHz are assumed. Accordingly, two bits can be used to select one of the three frequency reference values. Two cellular modes are also assumed: CDMA-850, and CDMA-PCS, requiring one bit for selection. Similarly, one bit can be assigned to select one of the two regions that support the CDMA-PCS standards, which in this example are the U.S. or Korea. Thus, two bits can be used to select one of the specific IF LO frequencies, depending on the cellular mode and the region of operation. For this system, the relevant transceiver characteristics include reference frequency values, cellular mode, and region. A total of four bits representing these characteristics form a sequence that contains the information necessary for a particular configuration.

TABLE 1

| TCXO freq. (MHz) | representation | Cellular mode | Representation | Region | representation |
|---|---|---|---|---|---|
| 19.2 | 00 | CDMA-850 | 0 | U.S. | 0 |
| 19.68 | 01 | CDMA-PCS | 1 | Korea | 1 |
| 19.8 | 10 | | | | |

For example, a synthesizer that has a TCXO with frequency of 19.68 MHz and is used with CDMA-PCS in Korea has a selection bit sequence (also referred to as configuration bits or selection word) of 0111. The new selection bit sequence has significantly fewer bits than the actual configuration parameters used to configure the synthesizer. The set of configuration parameters that are used by the synthesizer to generate the predetermined IF LO frequency are determined based on the selection bit sequence. In different embodiments, the selection bit sequence used may vary, and the method of determination as well as the configuration parameters may be different.

Figure 3:
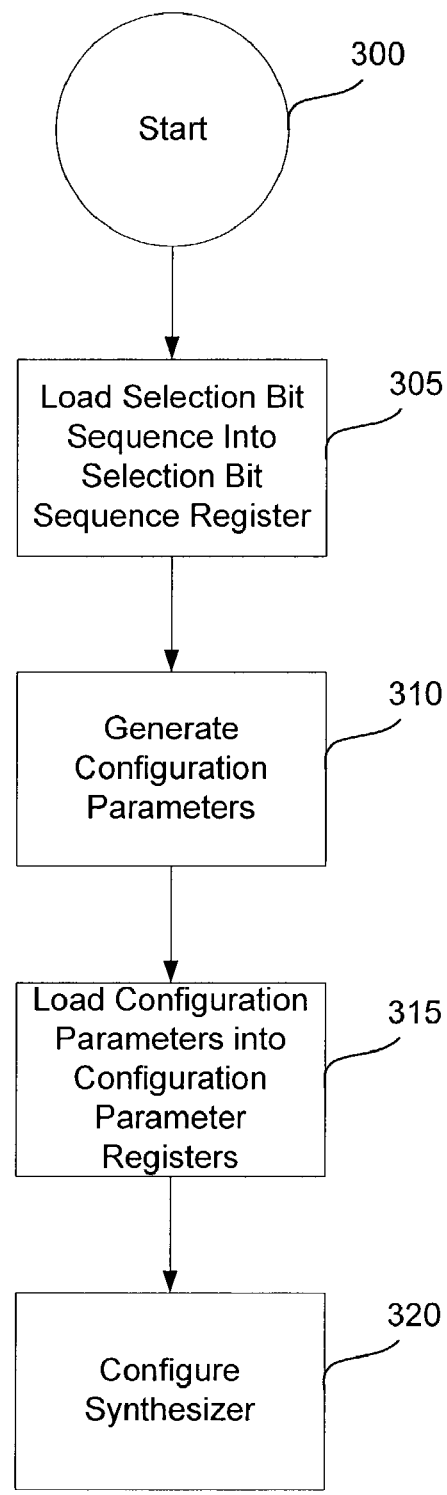

FIG. 3 is a flow chart of one embodiment of the initialization process when the synthesizer powers on. The flow chart starts at 300. In step 305, the microcontroller loads the synthesizer's selection bit sequence register with the selection bit sequence. In step 310, the configuration parameters needed by the synthesizer are generated based on the selection bit sequence. In step 315, configuration parameters are loaded into the synthesizer's configuration parameter registers. In step 320, the synthesizer is configured using the parameters to generate the desired frequency.

Figure 4:
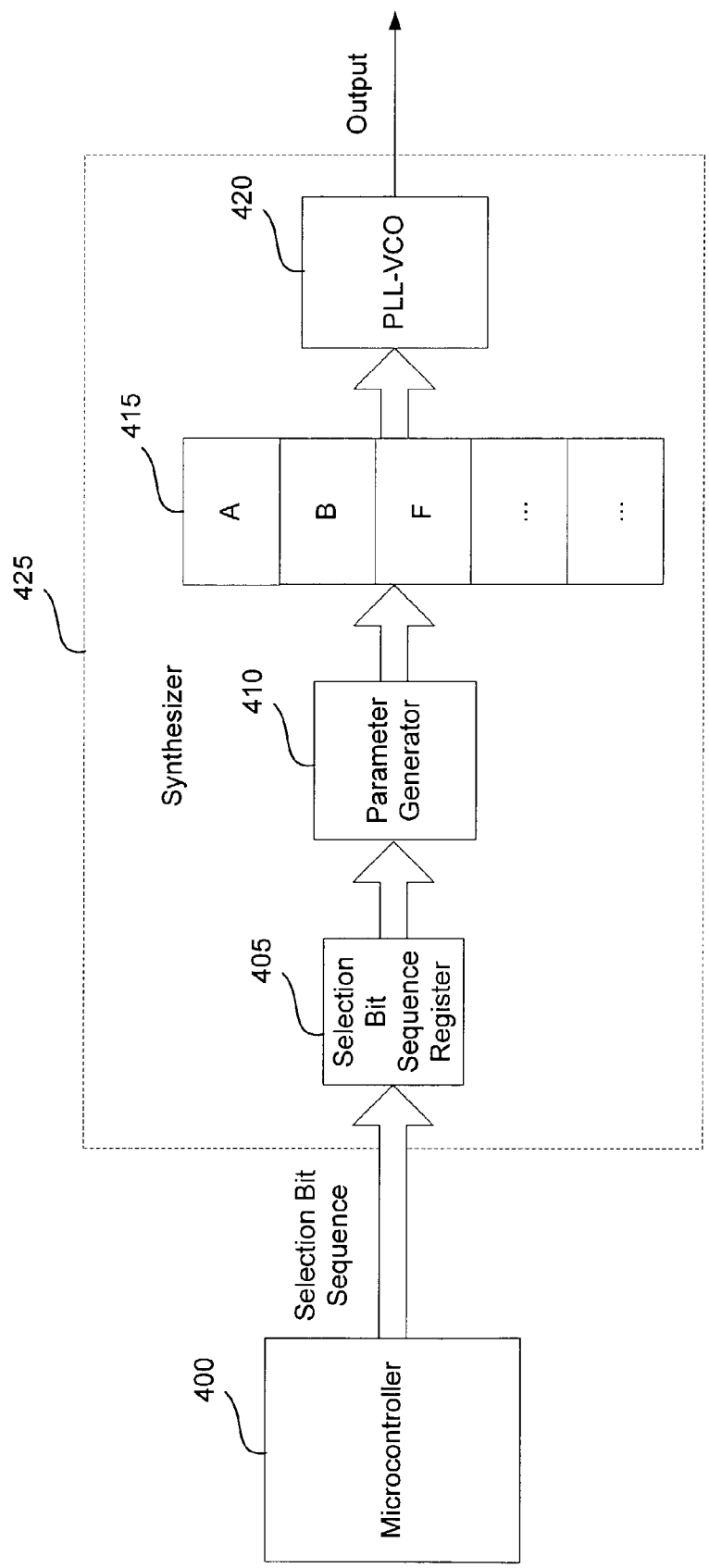
FIG. 4 is a block diagram of an embodiment of a synthesizer which uses compressed input initialization.

FIG. 4 is a block diagram of an embodiment of a synthesizer which uses compressed input initialization. Block 425 represents the synthesizer. External microcontroller 400 loads the selection bit sequence into selection bit sequence register 405. Parameter generator 410 determines the configuration parameters for generating the desired synthesizer frequency. The configuration parameters are loaded into configuration parameter registers 415, and then used to configure PLL-VCO 420 for generating the desired output.

In one embodiment, the parameter generator can be implemented as a lookup table (LUT). The combination of TCXO frequency, cellular mode and region determines a selection bit sequence. The selection bit sequence corresponds to a set of configuration parameters used to determine the IF LO frequency. The sets of values can be precomputed to construct a LUT, wherein the keys (or index) into the LUT comprise the selection bit sequence and the outputs of the LUT comprise the corresponding configuration parameters. The LUT functions as the parameter generator to produce the configuration parameters for a given selection bit sequence.

In one embodiment, a formula is derived to compute the output configuration parameters based on the input selection bit sequence. The parameter generator is implemented as a compute engine that calculates the configuration parameter outputs using such a formula. In certain embodiments, the parameter generator can be implemented as a combination of both a LUT and a compute engine.

Figure 5:
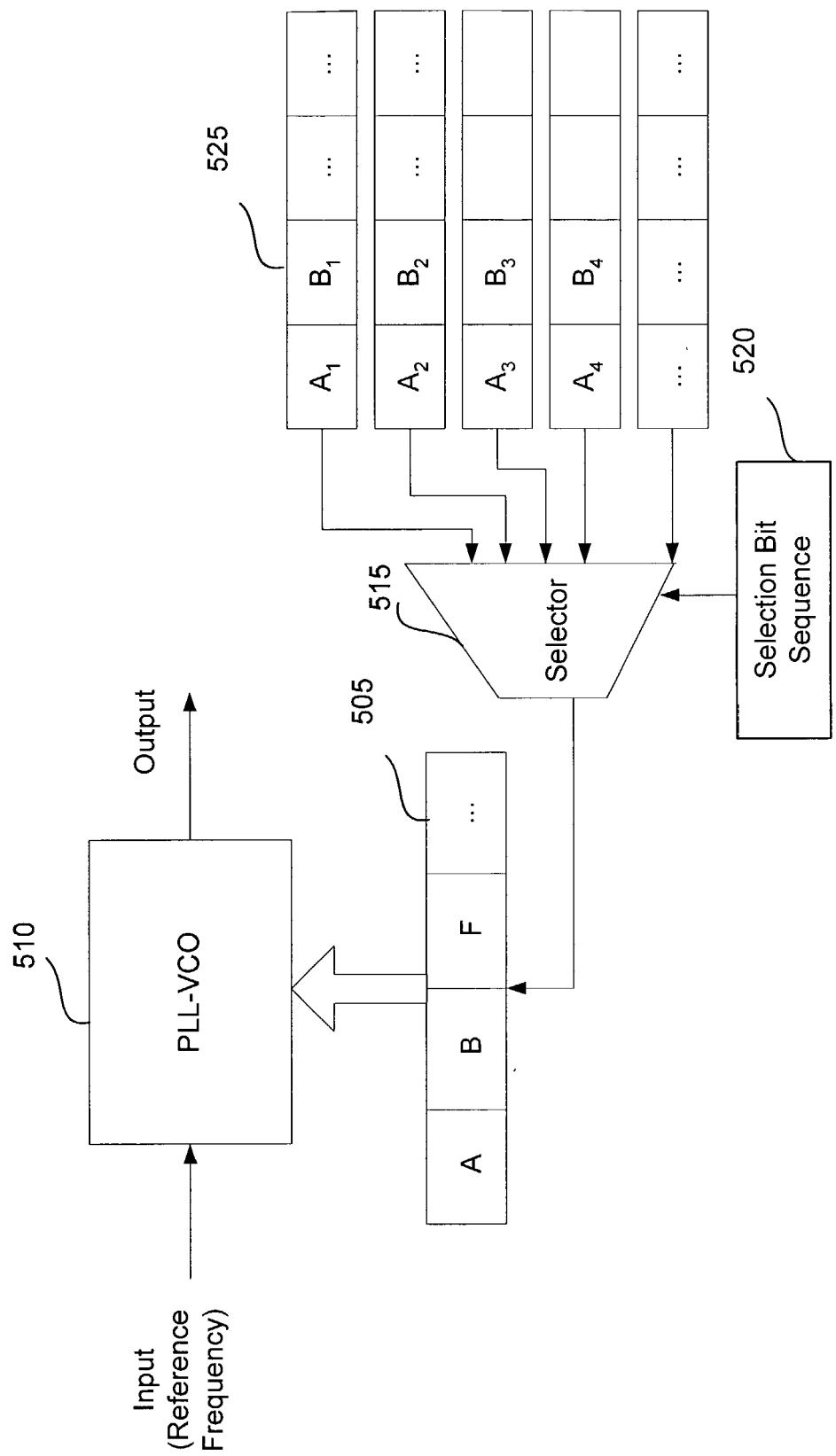
FIG. 5 is a block diagram of a frequency synthesizer that uses a lookup table to generate the configuration parameters.

FIG. 5 is a block diagram of a frequency synthesizer that uses a LUT to generate the configuration parameters. PLL-VCO 510 has an input signal with a stable reference frequency. Register bank 525 includes sets of configuration parameters that correspond to different output frequencies. A selection bit sequence is loaded into selection bit sequence register 520 and used by a selector 515 to select the corresponding set of configuration parameters. The selector may be implemented as a multiplexer or other appropriate device. Register bank 525 and selector 515 can be implemented together as a LUT. The selected configuration parameters are loaded into the configuration parameter register 505, and then read by PLL-VCO 510. PLL-VCO 510 uses the configuration parameters to generate the desired IF frequency output.

Since the selection bit sequence is compressed in nature, and since a few selection bits uniquely represent many synthesizer configuration parameter bits, the register load overhead is reduced. In one embodiment, the selection bit sequence is a word that is assigned its own register address, so that a single register write operation configures the IF LO. In one embodiment, the selection bit sequence is a part of an initialization register that establishes other operating parameters of the synthesizer, so that one register write configures the IF LO as well as other general synthesizer operations.

It should be noted that the selection bit sequence can be used for other synthesizers besides the IF LO synthesizer, for example, transmit LO synthesizers and receive LO synthesizers. By using the selection bit sequence, the number of register writes during the initialization period can be reduced compared to loading the whole set of possible LO parameters into the synthesizers, thereby reducing the initialization time.

Figure 6:
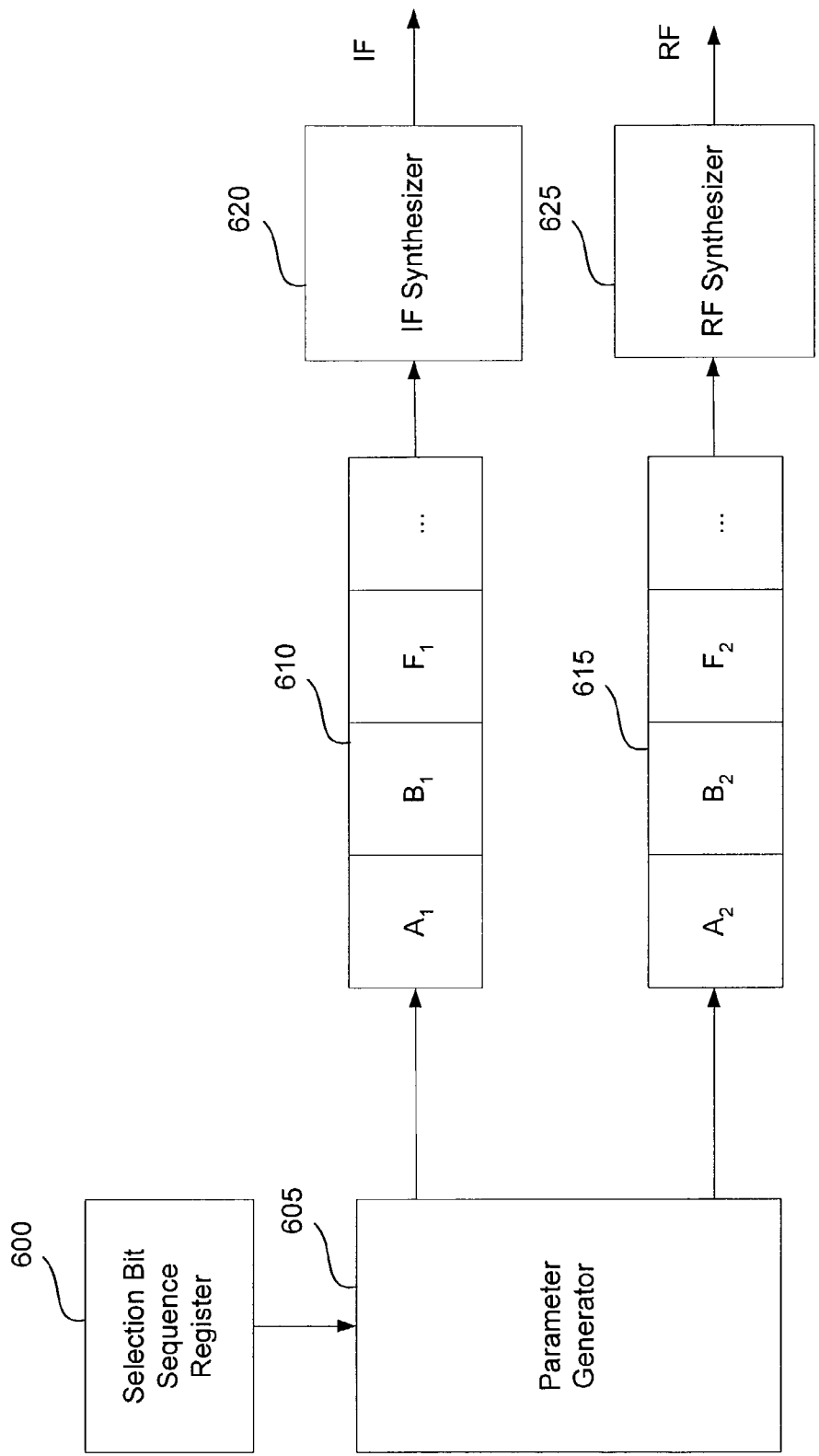
FIG. 6 is a block diagram illustrating how a selection bit sequence is used to configure multiple frequency synthesizers in one embodiment.

FIG. 6 is a block diagram illustrating how a selection bit sequence is used to configure multiple frequency synthesizers in one embodiment. Selection bit sequence register 600 stores the selection bit sequence that is loaded into parameter generator 605. Parameter generator 605 generates appropriate sets of configuration parameters corresponding to desired frequencies to be generated by IF synthesizer 620 and RF synthesizer 625. The configuration parameters are loaded into configuration parameter registers 610 and 615, respectively. IF synthesizer 620 reads the values in configuration parameter register 610 to configure its PLL-VCO for outputting desired IF frequency. RF synthesizer 625 reads the values in configuration parameter register 615 to configure its PLL-VCO for outputting desired RF frequency. In some embodiments, the selection bit sequence is used to generate configuration parameters for other synthesizers as well as other parts of the transceiver.

Power consumption of the synthesizer may be reduced as well. For a given system, the value of the selection bit sequence is relatively static. To avoid the problem of repeatedly loading the registers during power cycles, the synthesizer can use non-volatile memory, such as non-volatile RAM, ROM or a power supplied memory storage, to persist the values that would be lost if stored in volatile memory. For example, different embodiments use NVRAM circuitry, EEPROM, flash PROM, battery-backed RAM, capacitor-backed RAM or ROM. These types of memory are writable and remain intact when the rest of the device is powered off. In one embodiment, the configuration parameters are computed once, and then persisted in non-volatile memory. When the synthesizer is powered off due to inactivity, the configuration parameters are kept intact in non-volatile memory. When the synthesizer is powered on again, it can directly use the parameters stored without performing extra register loads, thereby saving power.

The frequency synthesizer design can combine the use of selection bit sequence and persistent storage of configuration parameters for optimal performance and power consumption. In one embodiment, the selection bit sequence is stored in non-volatile memory. When the synthesizer powers on, it uses the selection bit sequence to do either a lookup or a computation to generate the configuration parameters. In other embodiments, the configuration parameters are stored in non-volatile memory. The appropriate parameters are selected and used directly by the synthesizer.

A synthesizer design has been disclosed. The synthesizer design allows for configuration using fewer bits than what is normally required by compressing the configuration parameters into a selection bit sequence. The selection bit sequence or the synthesizer's configuration parameters can also be stored in non-volatile storage memory. Using the techniques described above, the synthesizer's configuration time and power consumption are reduced.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method of configuring a frequency synthesizer in a transceiver including:
   specifying a selection bit sequence that contains fewer bits than a corresponding configuration parameter wherein the selection bit sequence corresponds to a predetermined combination of transceiver characteristics;
   determining a plurality of synthesizer configuration parameters using the selection bit sequence; and
   configuring the frequency synthesizer using the plurality of synthesizer configuration parameters;
   wherein the transceiver characteristics include at least a frequency value and a transceiver characteristic other than the frequency value.

2. A method of configuring a frequency synthesizer as recited in claim 1 wherein the predetermined combination of transceiver characteristics are independent of channel information.

3. A method of configuring a frequency synthesizer as recited in claim 1 wherein more than one frequency synthesizer is configured.

4. A method of configuring a frequency synthesizer as recited in claim 1 wherein the frequency value includes one or more reference frequency values, and the transceiver characteristic other than the frequency value includes one or more of the following: a cellular mode and a region.

5. A method of configuring a frequency synthesizer as recited in claim 1 wherein:
   the transceiver characteristics include reference frequency values, cellular mode, and region; and
   the characteristics specify a desired LO frequency.

6. A method of configuring a frequency synthesizer as recited in claim 1 wherein determining the plurality of configuration parameters includes looking up the configuration parameters in a lookup table.

7. A method of configuring a frequency synthesizer as recited in claim 1 wherein determining the plurality of configuration parameters includes computing the plurality of configuration parameters based on a formula.

8. A method of configuring a frequency synthesizer as recited in claim 1 wherein determining the plurality of configuration parameters includes looking up the configuration parameters in a lookup table and computing based on a formula.

9. A method of configuring a frequency synthesizer as recited in claim 1 wherein the selection bit sequence is stored in a selection bit sequence register.

10. A method of configuring a frequency synthesizer as recited in claim 1 wherein the selection bit sequence is stored in a part of an initialization register that also establishes other operating parameters of the synthesizer.

11. A method of configuring a frequency synthesizer as recited in claim 1 wherein the plurality of configuration parameters is stored in a plurality of configuration parameter registers.

12. A method of configuring a frequency synthesizer as recited in claim 1 further including storing the selection bit sequence in non-volatile memory.

13. A method of configuring a frequency synthesizer as recited in claim 1 further including storing the selection bit sequence in non-volatile memory;
   wherein the non-volatile memory is non-volatile RAM.

14. A method of configuring a frequency synthesizer as recited in claim 1 further including storing the selection bit sequence in non-volatile memory;
   wherein the non-volatile memory is ROM.

15. A method of configuring a frequency synthesizer as recited in claim 1 further including storing the plurality of configuration parameters in non-volatile memory.

16. A method of configuring a frequency synthesizer as recited in claim 1 further including storing the plurality of configuration parameters in non-volatile memory;
wherein the non-volatile memory device is non-volatile RAM.

17. A method of configuring a frequency synthesizer as recited in claim 1 further including storing the plurality of configuration parameters in non-volatile memory;
wherein the non-volatile memory device is ROM.

18. A frequency synthesizer including:
a selection bit sequence register for storing a selection bit sequence that contains fewer bits than a corresponding configuration parameter and corresponds to a predetermined combination of transceiver characteristics;
a parameter generator that determines a plurality of configuration parameters using the selection bit sequence; and
a memory for storing the plurality of configuration parameters;
wherein the transceiver characteristics include at least a frequency value and a transceiver characteristic other than the frequency value.

19. A frequency synthesizer as recited in claim 18 wherein the frequency synthesizer is a part of a transceiver.

20. A frequency synthesizer as recited in claim 18 wherein the frequency value includes one or more reference frequency values, and the transceiver characteristic other than the frequency value includes one or more of the following: a cellular mode and a region.

21. A frequency synthesizer as recited in claim 18 wherein:
the transceiver characteristics include reference frequency values, cellular mode, and region; and
the characteristics specify a desired LO frequency.

22. A frequency synthesizer as recited in claim 18 wherein the parameter generator includes a lookup table.

23. A frequency synthesizer as recited in claim 18 wherein the parameter generator includes a compute engine.

24. A frequency synthesizer as recited in claim 18 wherein the parameter generator includes a lookup table and a compute engine.

25. A frequency synthesizer as recited in claim 18 wherein the selection bit sequence register is a part of an initialization register that also establishes other operating parameters of the synthesizer.

26. A frequency synthesizer as recited in claim 18 further including a plurality of configuration parameter registers used to store the plurality of configuration parameters.

27. A frequency synthesizer as recited in claim 18 wherein the selection bit sequence register is implemented with non-volatile memory.

28. A frequency synthesizer as recited in claim 18 wherein the selection bit sequence register is implemented with non-volatile RAM.

29. A frequency synthesizer as recited in claim 18 wherein the selection bit sequence register is implemented with ROM.

30. A frequency synthesizer as recited in claim 18 further including a plurality of configuration parameter registers used to store the plurality of configuration parameters; wherein the plurality of configuration parameter registers are in non-volatile memory.

31. A frequency synthesizer as recited in claim 18 further including a plurality of configuration parameter registers used to store the plurality of configuration parameters; wherein the plurality of configuration parameter registers are in non-volatile RAM.

32. A frequency synthesizer as recited in claim 18 further including a plurality of configuration parameter registers used to store the plurality of configuration parameters; wherein the plurality of configuration parameter registers are in ROM.

* * * * *